United States Patent [19]

Sieradzki

[11] Patent Number: 5,486,080
[45] Date of Patent: Jan. 23, 1996

[54] HIGH SPEED MOVEMENT OF WORKPIECES IN VACUUM PROCESSING

[75] Inventor: Manny Sieradzki, Gloucester, Mass.

[73] Assignee: Diamond Semiconductor Group, Inc., Glouster, Mass.

[21] Appl. No.: 269,159

[22] Filed: Jun. 30, 1994

[51] Int. Cl.⁶ .................................................. B65G 1/04
[52] U.S. Cl. ...................... 414/217; 414/225; 414/416; 414/744.2; 414/937; 414/786
[58] Field of Search .................................. 414/217, 331, 414/744.2, 744.4, 744.5, 744.6, 935, 937, 939, 941, 225, 416, 786

[56] References Cited

U.S. PATENT DOCUMENTS

| | | | |
|---|---|---|---|
| 3,901,183 | 8/1975 | Wittkower | 118/49.1 |
| 4,008,683 | 2/1977 | Rose | 118/49.1 |
| 4,282,924 | 8/1981 | Faretra | 165/80 E |
| 4,695,215 | 9/1987 | Jacoby et al. | 414/937 X |
| 5,083,896 | 1/1992 | Uehara et al. | 414/935 X |
| 5,186,594 | 2/1993 | Toshima et al. | 414/217 |
| 5,404,894 | 4/1995 | Shiraiwa | 414/416 X |

FOREIGN PATENT DOCUMENTS 1064231  3/1989  Japan ...................... 414/217
9104213  4/1991  WIPO ...................... 414/217

Primary Examiner—David A. Bucci
Assistant Examiner—James W. Keenan

[57] ABSTRACT

A high speed wafer processing apparatus employs two wafer transport robots to move wafers from two load locks past a processing station with gentle vacuum cycling and without pumpdown delays. Both robots alternately transport each wafer from the cassette at a single one of the load locks along a path from the cassette to a transfer position through the process station and back to the cassette, while pumpdown or venting of the other (second) load lock is carried out. They then transport the wafers from the second load lock through the process station. A wafer is "parked" at a transfer or orienting station, rather than handed over from robot to robot, so that the robots are not both tied up with a single wafer, and two or more wafers can move simultaneously along the path. Even for a fast ten second process time, work flow proceeds without interruption, periodic delay or dead time, and three to five minutes are available for venting, loading a new cassette and pumpdown. The robots enjoy partial path overlap, and operate in bucket brigade fashion without stop.

20 Claims, 3 Drawing Sheets

HIGH SPEED MOVEMENT OF WORKPIECES IN VACUUM PROCESSING

BACKGROUND OF THE INVENTION

The present invention relates to a method for moving workpieces in a vacuum chamber for high processing throughput. More specifically, it involves a method which maintains a nearly continuous flow of workpieces for processing as they are introduced into a vacuum chamber, aligned to a suitable orientation, processed one at a time, and removed from the vacuum chamber.

During the processing of silicon wafers in the manufacture of microelectronic circuits, up to twenty different types of tools are employed for effecting several hundred processing steps. Most of these processing steps must be performed in a vacuum chamber at pressures less than $1 \times 10^{-3}$ torr, and each requires from ten seconds to three minutes per wafer. Most of the processing tools operate on wafers one at a time in order to optimize control and reproducibility in a manufacturing environment.

In general, each operation on a wafer must be performed in a particular order, so that each operation must wait until rite completion of a preceding one, and, in turn, affects the time a wafer is available for a subsequent step. Tool productivity or throughput for vacuum processes that are relatively short, such as ion implantation, can be severely limited if the work flow to the processing location or platen is interrupted by sequential events, which may include, for example, the introduction of the wafer into the vacuum system, the transfer of a wafer in the vacuum chamber or the exchange of wafer carriers or cassettes.

In order to increase throughput, it is desirable to shorten the duration of sequential events, i.e., those events which must be performed consecutively. For this reason, the pump-down times (to high vacuum) and the venting times (to atmospheric pressure) are usually accomplished as quickly as possible, in less than about a half minute. However, high levels of foreign material or particles carried deep into the process line may result from the turbulence of such rapid cycling. These particles become distributed on the surface of the silicon wafer and result in more defects for a higher fraction of the micro-electronic circuits being fabricated, reducing manufacturing yields significantly.

The prior art has sought to address these concerns in a number of ways. Early systems employed wafer handling stations that introduced wafers into the vacuum process chamber through a load lock one at a time by mean of a gravitation slide. Each wafer was processed, and exited the vacuum process chamber through a second load lock as shown, for example, in FIG. 1 of U.S. Pat. No. 4,282,924. These systems suffered from several problems as wafer sizes employed in micro-electronic device fabrication evolved to larger diameters of six and eight inches, including wafer breakage and high levels of defect generation resulting from both sliding and rapid vacuum cycling. Also, manufacturers tracked work in process through the factory by tracking the progress of the wafer carriers, not the individual wafers, through the line, and since wafers were not returned to their original carrier or cassette, this complicated tracking of the work in process through the factory.

Another prior art approach used a wafer handling station in which the two cassettes are introduced, one each through load locks #1 and #2, and are pumped down simultaneously. Wafers were processed in an alternating manner from both load locks; for example, the first wafer from load lock #1, the second from load lock #2 and so on until all wafers from both load locks had been processed. In this system, wafers are returned to their original cassette, however the pumpdown and venting to atmosphere are sequential to the processing. Also this scheme requires that both cassettes of wafers be introduced to or removed from the load lock chambers in essentially the same time interval while processing is halted. Since production lots may very often be only a single cassette of wafers, this is not always possible. Another problem with this system is the requirement that the operator be present immediately following processing to exchange the processed cassettes of wafers for the next cassettes waiting to be processed, in order not to lose valuable process time.

It would be desirable to arrange the handling or movement of wafers in a manner which assured a continuous flow of wafers from cassettes which have been transferred into the vacuum, while increasing time available for slowly venting the load locks, exchanging the cassettes of processed wafers for unprocessed ones, and slowly pumping the load locks containing the cassettes to a suitable vacuum.

It would also be desirable to effect wafer handling with a small number of motive mechanisms while enhancing the flow of wafers.

SUMMARY OF THE INVENTION

These and other desirable ends are achieved in accordance with the present invention by a process line in which two cassettes are introduced via separate load locks. Multiple transport mechanisms, such as robots, move successive wafers from one cassette to a processing station and back to the cassette in a substantially continuous flow. The robots then process successive wafers from the second cassette. This allows ample time for introduction or removal of the first cassette, and its attendant pumpdown or venting operations, during processing of the second cassette. Wafers of the second cassette are then processed while a new first cassette is introduced or removed, and wafers of the first cassette are processed while the second cassette is introduced or removed. This provides a nearly continuous flow of workpieces in the vacuum chamber, as they are aligned to a suitable orientation and processed, while allowing a leisurely cycle of introduction and pumpdown, or venting and removal, of the other cassette.

DETAILED DESCRIPTION

The invention will be understood following a more detailed examination of several prior art handling systems which have been briefly discussed above.

Figure 1C:
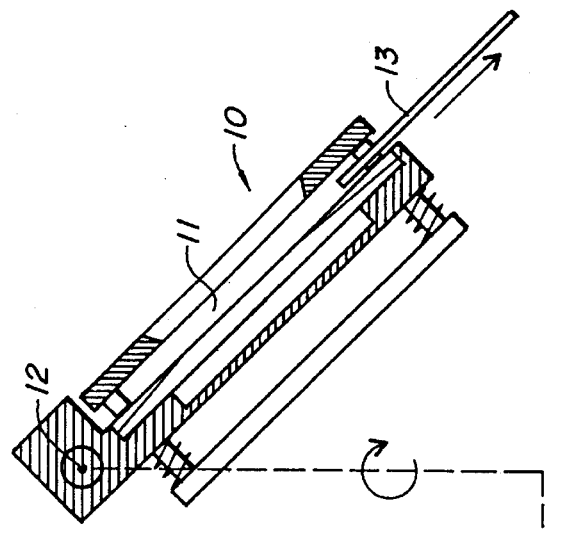
FIGS. 1A–1C illustrate a prior art wafer handling system.
Figure 1B:
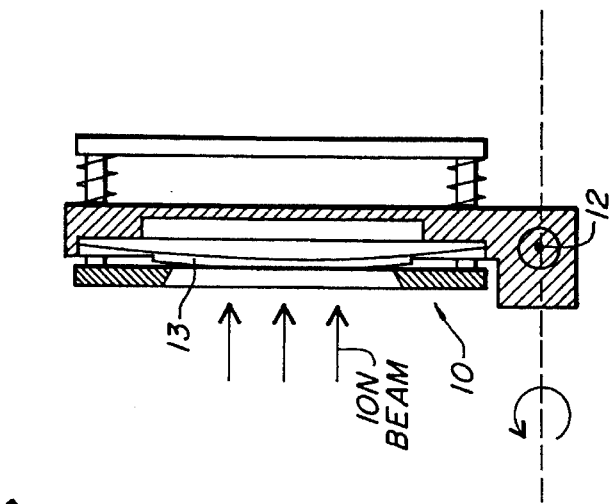
Figure 1A:
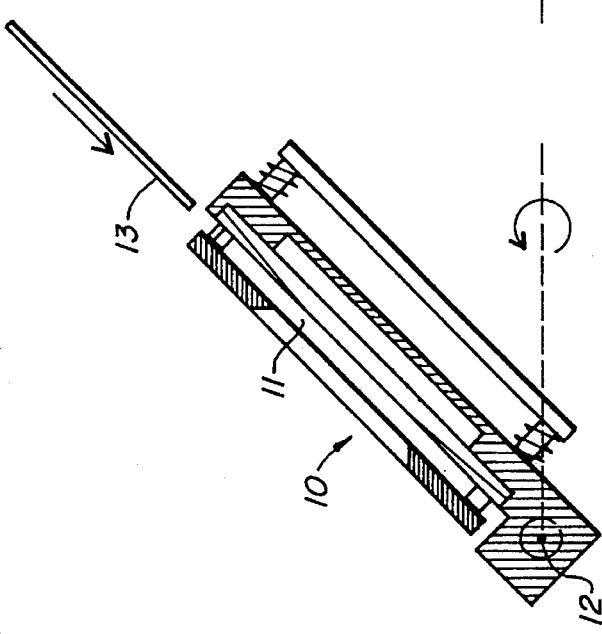

FIGS. 1A–1C illustrate a prior art wafer holder 10 which is moved by a support rod 12 to each of three rotational positions in which it receives, treats, and releases a wafer 13, respectively. In a first position, the wafer 13 slides by gravity feed into a slot 11 in the holder. The holder 10 then rotates about rod 12 up to an orientation normal to an ion beam where it holds the wafer in position for implantation or other treatment, after which it rotates downwardly, releasing the wafer to slide once again by gravity feed, along an exit path. Auxiliary handling mechanisms may be present in the input and output paths for picking the wafer from a cassette and returning it to a different cassette. This rocking stage construction provides a relatively simple mechanism for bringing wafers into and out of the processing station. However, the sliding motions may generate dust, and this continual feed-though mechanism involves highly sequential operation.

Figure 2:
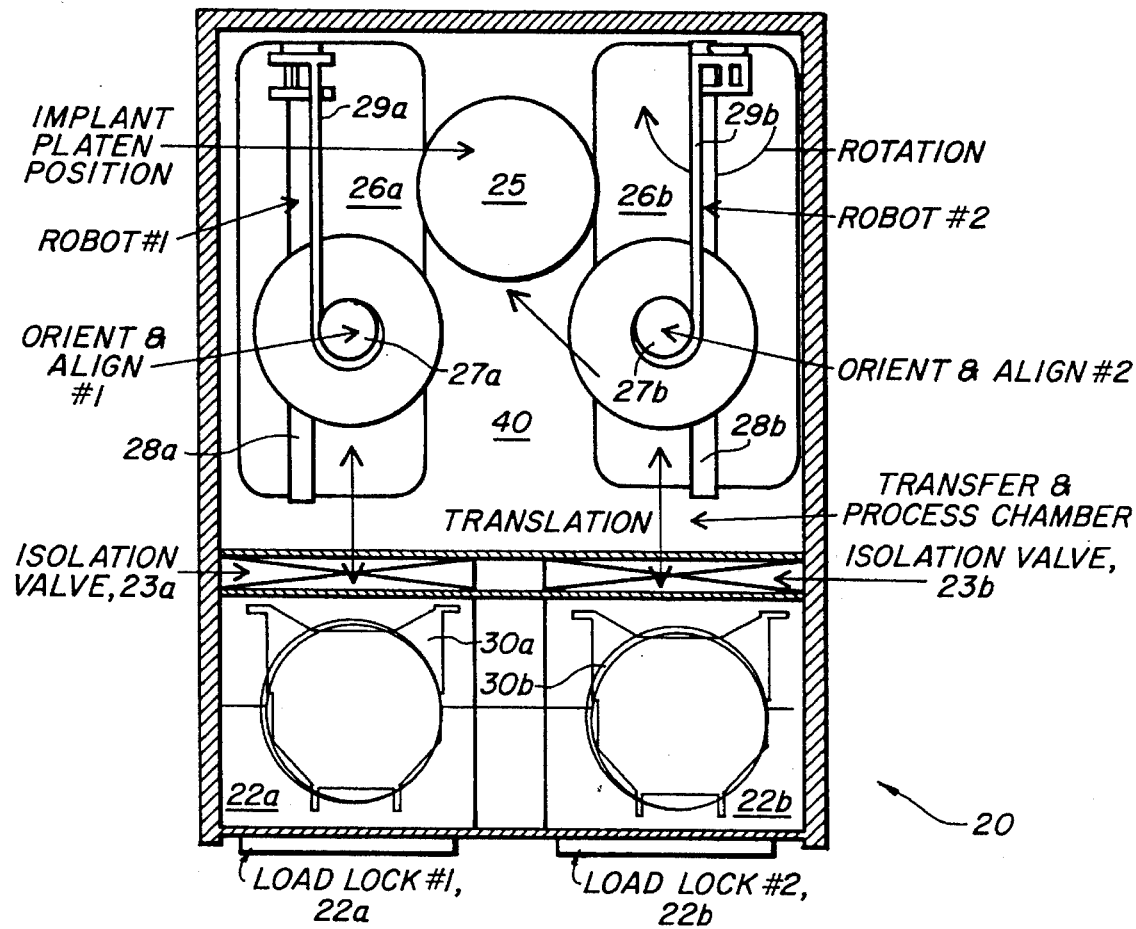
FIG. 2 illustrates another prior art wafer handling system.

FIG. 2 illustrates the operation of the second type of prior art wafer handling system 20 described above. In this system, first and second wafer carriers 30a, 30b are received by respective load locks 22a, 22b which communicate with the main vacuum chamber 40 via isolation valves 23a, 23b and which each may be independently vented and pumped down. A single process station 25, such as an ion beam implantation station, is centrally served by a pair of robots or wafer transport mechanisms 26a, 26b. Each transport is capable of axial motion along a member 28a, 28b and pivotal or articulated motion of an arm 29a, 29b. The axial motion is used to move wafers between the vacuum chamber and the carrier residing in a load lock, and the articulated arm is used for more constrained motions within the vacuum chamber, for example, to swing from an intermediate station (27a or 27b) to the implantation station 25.

Operation of this device is as follows. For a single wafer, illustratively in a carrier in load lock 22a, the corresponding transport 26a advances linearly to grip a wafer, then retracts to place it on the alignment turntable 27a. After proper alignment of the flat on the wafer edge, the articulated arm 29a lifts the wafer and rotates to deposit in at station 25. Removal entails the reverse rotation and without stopping at the alignment table, the arm advances linearly to re-deposit the wafer in the carrier, which is then raised one space to bring the next wafer into a position accessible to the transport. As the "A" wafer (from wafer carrier 30a) is being treated at the implantation station, the second robot 26b is loading and orienting a "B" wafer from the second wafer carrier 30b. It then transports this wafer into the implantation station 25 just as the "A" wafer is being unloaded therefrom. Thus, the wafers form a continuous stream through the implantation station coming alternately from each of the two cassettes 30a, 30b. However, when each cassette has been processed, which for equal size loads will occur within a few seconds of each other, then the rather time-consuming steps of venting, cassette changing and pumpdown must be performed while the process station sits idly. As noted above, this sequential operation compels one to employ fast vacuum cycling, which, in turn, results in dirtier processing.

In distinct contrast to the foregoing prior art, a processing system 100 in accordance with the present invention allows flat thin workpieces to be introduced into a vacuum system for high speed processing in nearly a continuous flow and without introducing sequential delays. The system has two load locks, and the workpieces or wafers are processed one at a time, and each is returned to the same workpiece carrier or cassette from which it came. When all of the workpieces have been processed from the first cassette, that cassette is returned to atmospheric pressure in the load lock during the time that the next cassette of wafers is being processed from the second load lock. The flow of work is such that the pumpdown and vent times are not sequential to the processing steps, but occur in background for each cassette as the other cassette of wafers is being processed. Thus, the timing of cassette exchange is not critical to throughput as in the prior art system of FIG. 2, and may occur at any time during the processing of the other cassette. Correspondingly, slow vacuum cycling may be employed, using simpler equipment and cleaner conditions, without introducing processing delay.

Figure 3:
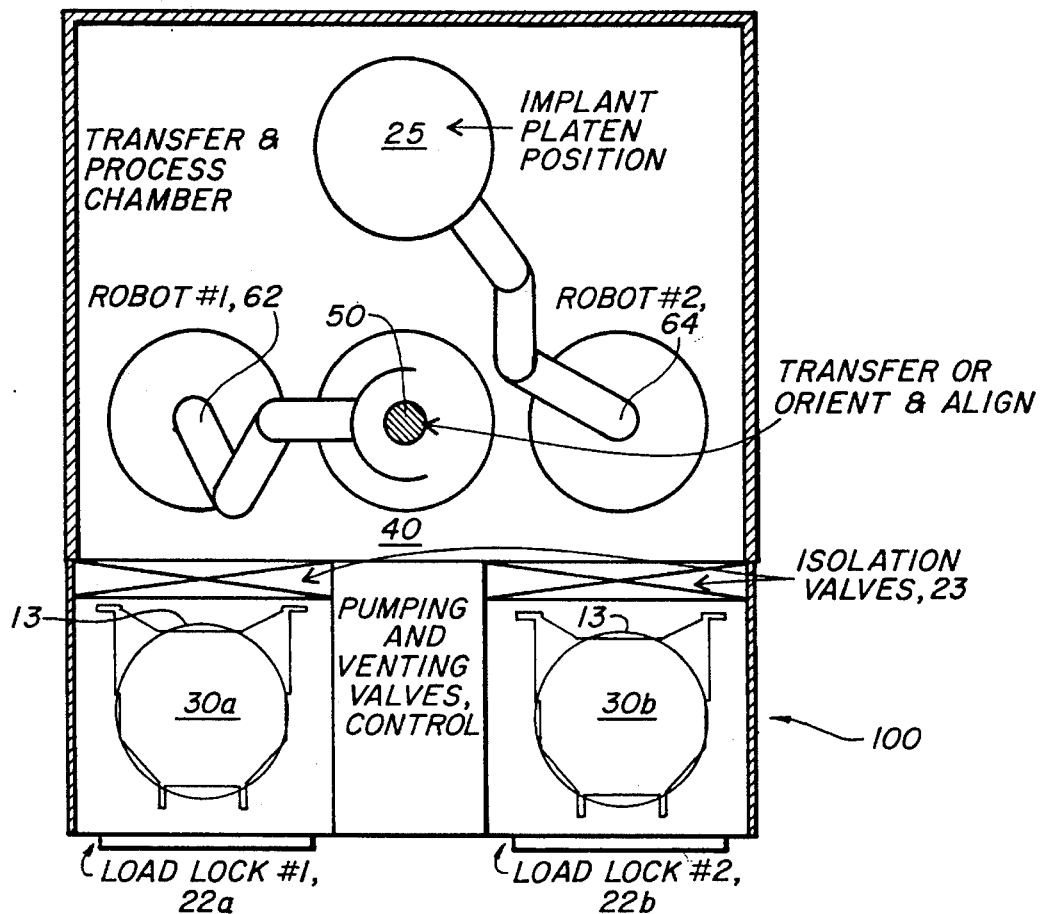
FIG. 3 illustrates a water handling system in accordance with the present invention.

A simple embodiment of the invention is shown in FIG. 3. Semiconductor wafers 13 are moved into a vacuum chamber 40 and processed one at a time or serially by introducing a cassette 30a of wafers 13 into the first load lock 22a. A second cassette of wafers may be introduced into a second load lock 22b subsequently without impacting the overall productivity or throughput of the system, and the amount of time available for introducing the second cassette and pumping down its load lock is essentially the processing time required by the entire first cassette, which is dependent on process time per wafer. For process times of approximately ten seconds, this time duration can be approximately five minutes for a cassette which holds twenty-five wafers.

The basic elements of the system 100 include first and second robots or wafer handlers 62, 64 in the vacuum chamber 40, an implantation station 25, and a transfer station 50. The implantation station may comprise, for example, a flat platen or stage with suitable registration, clamping and cooling mechanisms for positioning and holding the wafer during ion beam treatment. The transfer station 50 on the other hand may comprise a common alignment turntable which orients the wafer prior to processing, or if alignment is not necessary (for example, for implantation normal to the wafer surface) may comprise a simple pedestal or stand.

The robots 62, 64 are shown as multi-segmented articulated arms. However, their actual mechanical implementation may be varied to include ram-like motions produced by any of several different mechanisms, so long as they efficiently perform the required movements described, further below. In general, the robots do not actively grip the wafers, but instead slide a yoke-like support under the wafer as it is raised to an accessible position by lift pins or the like. The robot is then required to execute movements without undergoing extreme accelerations that might cause the wafer to slide off. These movements consist of a combination of one or more linear and rotational motions which occur in a program-controlled sequence that moves the water from its starting position to the next desired position.

Operation of the system 100 proceeds as follows. Load lock #1 (lock 22a) is pumped down to approximately 100 millitorr after which its isolation valve 23 opens to allow the transfer of wafers from the load lock into chamber 40 and ultimately to the process station or platen. Robot #1 (robot 62) removes a water 13 from the cassette 30a in load lock #1 and transfers the wafer to the wafer transfer station 50. In the embodiment shown, the wafer transfer station 50 is a simple wafer alignment turntable, such as employed on the Model E-220 1 sold by the Varian Company of Gloucester, Mass., and the transfer station holds a wafer and also is used for alignment. Robot #2 (robot 64) then removes the wafer from the transfer or alignment station 50 and places the wafer 13 on the platen 25 at the processing station. During this time, robot #1 returns to load lock #1, gets the next wafer and places the next wafer to be processed onto the transfer station 50. After the first wafer has been processed at the implantation station 25, robot #1 removes the processed wafer from the platen. Meanwhile, as robot #1 is picking up the processed wafer from platen 25, robot #2 has already picked up the next wafer resting at the transfer station 50, and immediately places it on the implantation platen. As this second wafer is being processed, robot #1 continues to carry the processed wafer moving it to the cassette sitting in load lock #1, where it then picks up the next wafer in line to be processed from the cassette and proceeds to place it onto the transfer station 50. Robot #1 then again advances to the process station where it proceeds to unload the second processed wafer from the implantation platen 25, while robot #2 again having picked up a wafer waiting at the transfer station 50, immediately shuttles it into position on the implantation platen 25.

Thus, to process wafers from the first cassette, robot #1 handles the first and third legs of each wafer's travel, while robot #2 handles the middle step, shuttling the wafer from the transfer station to the processing station. In particular, at least one and often both robots are occupied at each instant, and two wafers are in transit through the vacuum chambers at any given time, with both robots simultaneously participating in the loading and unloading of the process station itself so that the ion beam processing is interrupted only for a brief instant. These steps are repeated until all of the wafers in the cassette 30a residing in load lock #1 have been processed.

At that time, the two robots reverse their roles, and operate in a similar and symmetric fashion to transport, process and return all the wafers in load lock #2. In this case, robot #2 operates to pick up and move wafers from the second cassette 30b to the transfer station 50, and, later, to pick up and to return each processed wafer 13 from the implantation platen 25 to the cassette 30b, while robot #1 operates simply to shuttle the untreated wafers waiting at the transfer station 50 quickly into position on the implantation platen 25. Meanwhile, while the wafers of the second cassette 30b are being processed, the first load lock 22a is vented and a new first cassette 30a' (not shown) is introduced into lock 22a, and the lock 22a is pumped down. These venting and pumpdown steps may occur over the course of several minutes, for a typical size process batch in cassette 30b, and may thus employ gentle pressure cycling that avoids turbulent conditions.

Thus, the robots both work in a bucket-brigade fashion to achieve a high-speed throughput, and although only one cassette is processed at a time, the transport mechanisms and control regimens are simple, and all wafers are moved and processed in a similar manner, with the respective robots periodically exchanging functions as each new cassette comes on line.

Notably, during the time interval that wafers from one load lock are being processed, the other load lock is vented, any processed wafers therein are removed, a new cassette of semiconductor wafers to be processed is placed in the load lock, the door is closed, the load lock is evacuated, and the valve communicating with the transfer chamber (if used) or vacuum chamber is opened. Thus, as processing of the current set of wafers is completed, the new cassette is already in position, and the robot which accesses that cassette proceeds without any delay to pick up the first of the new wafers and deposit it at the transfer station 50. It then continues the two steps of moving a fresh wafer to the transfer station, and carrying a processed wafer from the process station back to its wafer carrier, as the opposite robot shuttles wafers from the transfer station 50 to the process station 25.

Thus, the entire sequence of events, including the repetitive alternating steps of operation of the two robots proceeds cyclically without interruption, and the changeover from one cassette to another does not delay even temporarily the next step taken by a robot, or change the rate of wafer traffic along the process line.

The advantages of this method of moving wafers into and out of a vacuum system include:

1) the continuous flow of work to the process station and the achievement of throughputs of over 200 workpieces or wafers per hour for serial process systems without interruption for operator actions, even when process times are short; and 2) pumpdown and vent to atmosphere functions which are not sequential to the processing and transport events, but rather which occur simultaneously with processing, in background, so a greater time can be allotted for these functions, reducing turbulence during vacuum cycling and resulting in reduced generation or deposition of particles, and potentially higher yields for micro-electronic device fabrication.

The invention has been described with reference to a basic embodiment wherein a plurality of robots operate to hand along wafers from a first load lock or cassette in a continuous flow through a processing station. Illustratively a transfer or orienting/transfer station 50 allows a wafer to be temporarily "parked" so that while each wafer is alternately handled by one, then the other, robot, this "bucket brigade" transport schema does not require direct robot-to-robot transfers, and thus does not tie up both robots with a single wafer at any time. This allows multiple wafers from a single cassette to be in transit at any instant. The same plurality of robots also similarly transports the wafers from an entirely separate load lock or cassette, along separate transport paths, through the same process station.

Figure 4:
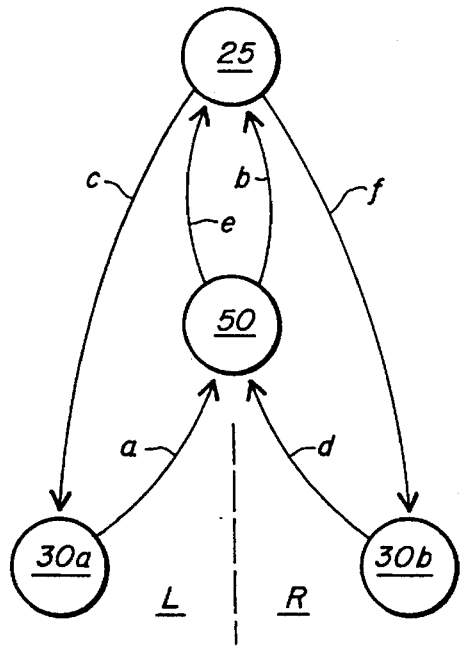
FIG. 4 illustrates exemplary transport paths in a simple embodiment of the wafer handling system of FIG. 3.

FIG. 4 is a wafer path diagram of the transport steps just described for operation of the system of FIG. 3. The adjacent load locks 22a, 22b are illustrated as positioning their cassettes 30a, 30b on left and right sides of the system, marked "L" and "R". As shown, the wafers from the first cassette follow successive path segments a,b,c, and the wafers from the second cassette follow three entirely disjoint successive path segments d,e,f, each of which curves back from one side to the other as a wafer shuttles through the process station, so that the next entering wafer is not impeded as the two robots swing the two processed and unprocessed wafers in and out of the treatment station 25. The system employs a stark minimum number of elements—two robots and one transfer station—to provide essentially uninterrupted work flow through the processing station while completely eliminating the trade-off of sequential loading and fast vacuum cycling.

As noted above, for typical fast ion beam process times of about ten seconds per wafer, the illustrated transport paths are readily implemented without resort to robot movement accelerations of a magnitude that would cause wafer sliding or transport mishaps. For example, robot #1 may return a wafer along path "c", and pick up and deposit a new wafer along path "a", and then, empty, quickly position itself to pick up the next wafer at the processing station for the next "c" movement, taking only one to three seconds for each wafer movement step.

However, it is possible that special process considerations may render the transport steps rate-limiting. For example, if the ion beam treatment time were under several seconds, then it could become difficult to operate a single robot to perform three path motions as described without risking wafer dropping. In that case, the invention further contemplates the provision of additional parking or process stations to be located along the transport line. In the event the processing station 25 operates with an extraordinarily short process time, the invention further contemplates systems including additional robots, or a combination of additional robots and stations located along the transport path, in order to maintain continuous transport of two or more wafers without requiring excessively abrupt robot movements or an acceleration consistent with the low-inertia requirements of the delicate wafer-handling process, and without introducing delays or dead time at the process station. Furthermore, the invention is not limited to a system having two load locks and two cassettes, but is readily adapted to systems with a greater number of load locks, cassettes, or both.

In addition, while the above disclosure has assumed a conventional form of cassette loading (for example, wherein a cassette sits within a load lock and rides an elevator post up and down to position successive ones of its wafers in the plane of the robot), and has assumed a pair of robots with only partially overlapping ranges, the invention is readily adapted to other forms of cassettes loading. For example, in a system wherein the entire cassette is advanced from the lock into the vacuum chamber, the system may be arranged so that the cassettes are advanced to closely contiguous positions, each of which is accessible to both robots. In that case, if no orienting station is necessary, (e.g. for a bulk doping treatment) the robots may simply alternate picking up wafers and taking them the entire distance from a cassette to the process station in a single movement, and then back.

However, rather than custom-fabricated long-reach robots, the illustrated embodiments utilize commercially available articulated robots that can have a mechanical reach made up of a series of short leg rotatable segments, wherein neither robot reaches two cassettes, but both can overlap in an intermediate portion of their range of motion, at the transfer station 50. Further, equipment costs are further reduced in that by processing one cassette of wafers as the other is being slowly pumped down, a small vacuum pump may be used, or even a single small pump which is selectively valved to evacuate both of the load locks.

The invention being thus disclosed, variations and modifications will occur to those skilled in the art, and such variations are understood to be a part of the invention, as set forth in the claims appended hereto.

We claim:

1. Apparatus for processing semiconductor wafers from cassettes in vacuum, said apparatus comprising
   a vacuum chamber maintained at high vacuum and containing a first robot, a second robot and a wafer transfer station for transferring a wafer from one robot to the other robot,
   a first load lock and a second load lock through each of which a cassette of wafers can be loaded and unloaded from atmospheric pressure to be selectively introduced in said vacuum chamber,
   pumping and venting means for pumping down and for venting each of said load locks,
   a process station at said vacuum chamber for receiving wafers from and providing wafers to both the first and the second robot, and
   control means for controlling said first and second robots to successively and continuously move wafers from one load lock to the process station and back via the transfer station while operating said pumping and venting means to pump down or vent the other load lock.

2. Apparatus according to claim 1, wherein said transfer station includes a mechanism for rotationally orienting a wafer.

3. Apparatus according to claim 1, wherein the first and second robots are configured so that both robots reach the process station and the transfer station.

4. Apparatus according to claim 3, wherein the control means controls the robots to move wafers introduced at the first load lock along different paths than the robots move wafers introduced at the second load lock.

5. Apparatus according to claim 3, wherein each robot can reach wafers at only one of the first and second load locks.

6. Apparatus according to claim 1, wherein the robots maintain at least two wafers simultaneously in transit from one load lock through the vacuum chamber.

7. Apparatus according to claim 1, wherein the pumping and venting means includes
   a single load lock pumping means for pumping down a load lock when connected thereto, and
   valve means for selectively connecting the single load lock pumping means to each of the first and second load locks in separate time intervals.

8. Apparatus according to claim 1, wherein said two robots move each wafer along a path having three legs between a cassette to said process station and back, and each wafer is carried by alternating ones of the robots as it moves along successive ones of the three legs.

9. Apparatus according to claim 1, wherein said two robots each simultaneously carry different wafers along different segments of a transport path, continuously picking up and dropping off the carried wafers so that each wafer is alternately carried by each robot as it is transported.

10. A method of transporting wafers past a process station in a vacuum chamber, such method comprising the steps of
    providing first and second load locks for receiving first and second cassettes of wafers, respectively, with means for pumping down each load lock during a pumpdown time and means for venting the load locks so that a cassette loaded therein achieves isobaric communication with the vacuum chamber and with the atmosphere, respectively,
    providing a process station in the vacuum chamber,
    providing a first and a second transport robot for transporting wafers between positions, both robots being operative to move wafers through the process station where each wafer resides during a processing time,
    controlling the robots so that they alternately handle each wafer as it moves from a cassette through the process station, and
    controlling the first and second robots to move all wafers from the first cassette through the process station and back to the first cassette, and subsequently to move all wafers from the second cassette through the process station thereby allowing an extended time for operation of each load lock when wafers from the other load lock are being transported without stopping processing at said process station.

11. The method of claim 10, wherein the step of providing first and second load locks with means for pumping and venting includes providing a low capacity pump effective for pumping the load locks such that said pumpdown time is many times longer than said processing time of.

12. The method of claim 11, further comprising the step of alternately connecting the low capacity pump to each load lock during a period when cassettes from the other load lock are processed.

13. The method of claim 10, further comprising the step of providing a transfer station, and controlling the robots so that one robot parks a wafer at the transfer station as it is transported between the load lock and the process station, and the other robot picks up the wafer from the transfer station, the two robots being synchronized to transport the wafer along different portions of a transport path thereby enhancing process work flow.

14. The method of claim 10, wherein each of two robots is associated with a different load lock for picking up and returning wafers at that load lock, and the robots are controlled so that one robot parks a wafer at a transfer station and another robot loads the parked wafer into the process station while said one robot proceeds to simultaneously unload a previous wafer.

15. The method of claim 14, wherein the two robots are controlled to transport wafers along two mutually disjoint sets of transport paths.

16. The method of claim 15, wherein the robots are controlled to simultaneously move at least two wafers from the same cassette along a path through the process station.

17. Processing apparatus comprising:
   a vacuum chamber for processing a workpiece, the vacuum chamber having a process line including a process station and a transfer station,
   a first load lock for receiving a batch of workpieces at ambient pressure and communicating with the vacuum chamber at a reduced pressure,
   a second load lock for receiving a batch of workpieces at ambient pressure and communicating with the vacuum chamber at a reduced pressure,
   a first transfer mechanism for moving workpieces between the first load lock and the process line,
   a second transfer mechanism for moving workpieces between the second load lock and the process line,
   means for moving workpieces between the transfer station and the process station, said means for moving including at least one of said first and said second transfer mechanism and
   synchronizing means for synchronizing the operation of said first and second transfer mechanisms to move workpieces back and forth between one of said load locks and the process station while the other of said load locks operates to receive or discharge its batch of workpieces at ambient pressure, whereby vacuum cycling is reduced and processing of workpieces from one load lock proceeds as the other load lock is vented and pumped down.

18. Processing apparatus according to claim 17, wherein each of said first and said second transfer mechanisms is configured to transfer workpieces between the process station and the transfer station, and both mechanisms sequentially handle workpieces from a single load lock.

19. Processing apparatus according to claim 18, wherein the first and second transfer mechanisms move workpieces in at least partially overlapping time intervals.

20. Wafer processing apparatus comprising:
   a vacuum process chamber,
   a first and a second load lock each load lock operating to provide wafers from a pressure region to the vacuum process chamber, said load locks each being sized and configured to hold a cassette of wafers at a time,
   moving means for moving wafers between said load locks and the vacuum process chamber, and
   means for synchronizing operation of said load locks with operation of said moving means so that wafers of a batch from one load lock are moved in the vacuum process chamber while said other load lock undergoes pressure change for transfer of its batch of wafers between the vacuum process chamber and the pressure region,
   said moving means including at least two robots, and said synchronizing means synchronizing operation of said robots to each successively transport a wafer as it is moved from one load lock to the process chamber and back to the same load lock, and simultaneously move at least two wafers through the vacuum process chamber.

* * * * *

UNITED STATES PATENT AND TRADEMARK OFFICE
CERTIFICATE OF CORRECTION

PATENT NO. : 5,486,080
DATED : January 23, 1996
INVENTOR(S) : Manny Sieradzki

It is certified that error appears in the above-indentified patent and that said Letters Patent is hereby corrected as shown below:

Column 1, line 24, replace "rite" with --the--;

Column 3, line 33, after "rotation and" insert --,--.

Signed and Sealed this

Seventeenth Day of September, 1996

Attest:

BRUCE LEHMAN

Attesting Officer

Commissioner of Patents and Trademarks